(12) United States Patent
Doherty et al.

(10) Patent No.: US 6,330,744 B1
(45) Date of Patent: Dec. 18, 2001

(54) CUSTOMIZED ELECTRICAL TEST PROBE HEAD USING UNIFORM PROBE ASSEMBLIES

(75) Inventors: Robert C. Doherty, Foothill Ranch; Thomas K. Stewart, Fountain Valley, both of CA (US)

(73) Assignee: PJC Technologies, Inc., Lake Forest, IL (US)

( * ) Notice: Subject to any disclaimer, the term of this patent is extended or adjusted under 35 U.S.C. 154(b) by 0 days.

(21) Appl. No.: 09/351,423

(22) Filed: Jul. 12, 1999

(51) Int. Cl.[7] .................................................. H01R 43/00
(52) U.S. Cl. ................................ 29/825; 29/846; 29/593; 29/592.1; 324/757; 324/762; 324/761
(58) Field of Search ..................................... 29/825, 592.1, 29/593, 846; 324/158.1, 754, 761, 762, 757

(56) References Cited

U.S. PATENT DOCUMENTS

| | | | |
|---|---|---|---|
| 4,896,107 | * 1/1990 | Maelzer et al. | 324/158 |
| 4,963,821 | 10/1990 | Janko et al. | |
| 4,968,589 | 11/1990 | Perry | 430/314 |
| 4,977,370 | * 12/1990 | Andrews | 324/158 F |
| 5,400,220 | 3/1995 | Swamy. | |
| 5,414,329 | 5/1995 | Iino et al. | |
| 5,469,072 | 11/1995 | Williams et al. | |
| 5,521,518 | 5/1996 | Higgins | 324/754 |
| 5,534,784 | 7/1996 | Lum et al. | 324/757 |
| 5,550,482 | 8/1996 | Sano | 324/758 |
| 5,672,977 | 9/1997 | Yamada | 324/754 |
| 5,747,994 | * 5/1998 | Suga | 324/158.1 |
| 5,754,057 | * 5/1998 | Hama et al. | 324/754 |
| 5,777,484 | 7/1998 | Woith et al. | 324/754 |
| 5,808,259 | * 9/1998 | Spinner | 219/56.22 |
| 5,825,192 | 10/1998 | Hagihara | 324/757 |
| 5,828,226 | 10/1998 | Higgins et al. | 324/762 |
| 5,869,974 | 2/1999 | Akram et al. | 324/754 |
| 5,909,124 | * 6/1999 | Madine et al. | 324/761 |

OTHER PUBLICATIONS

Horizontal Probe Assembly.

* cited by examiner

Primary Examiner—Carl J. Arbes
Assistant Examiner—Minh Trinh

(57) ABSTRACT

An improved method of manufacturing an electrical probe test head is provided for testing electrical circuits, such as, e.g., IC-chips and circuit boards. The test head can be employed in circuit testers, such as, e.g., circuit board testers and probe cards, to provide an electrical connection between the terminals of the circuit to be tested and external test circuitry. The method of manufacturing the test head includes selecting an electrical circuit having terminals arranged in a terminal pattern. Vertical probe pitch series sets are provided, each of which includes a plurality of electrically conductive rigid pins, which is made of a suitable material, such as, e.g., tungsten. Each of the rigid pins has a pin shaft and a pin contact tip. The pin contact tips are configured in a pin pattern corresponding to the terminal pattern, i.e., the pattern in which the terminals of the circuit to be tested are arranged. Each of the vertical probe pitch series sets further includes a registration medium, which encapsulates at least a portion of each of the pin shafts. The vertical probe pitch series sets can be inventoried and subsequently arranged and affixed with respect to each other, such that the pin contact tips are arranged in a pin pattern corresponding to the terminal pattern.

24 Claims, 12 Drawing Sheets

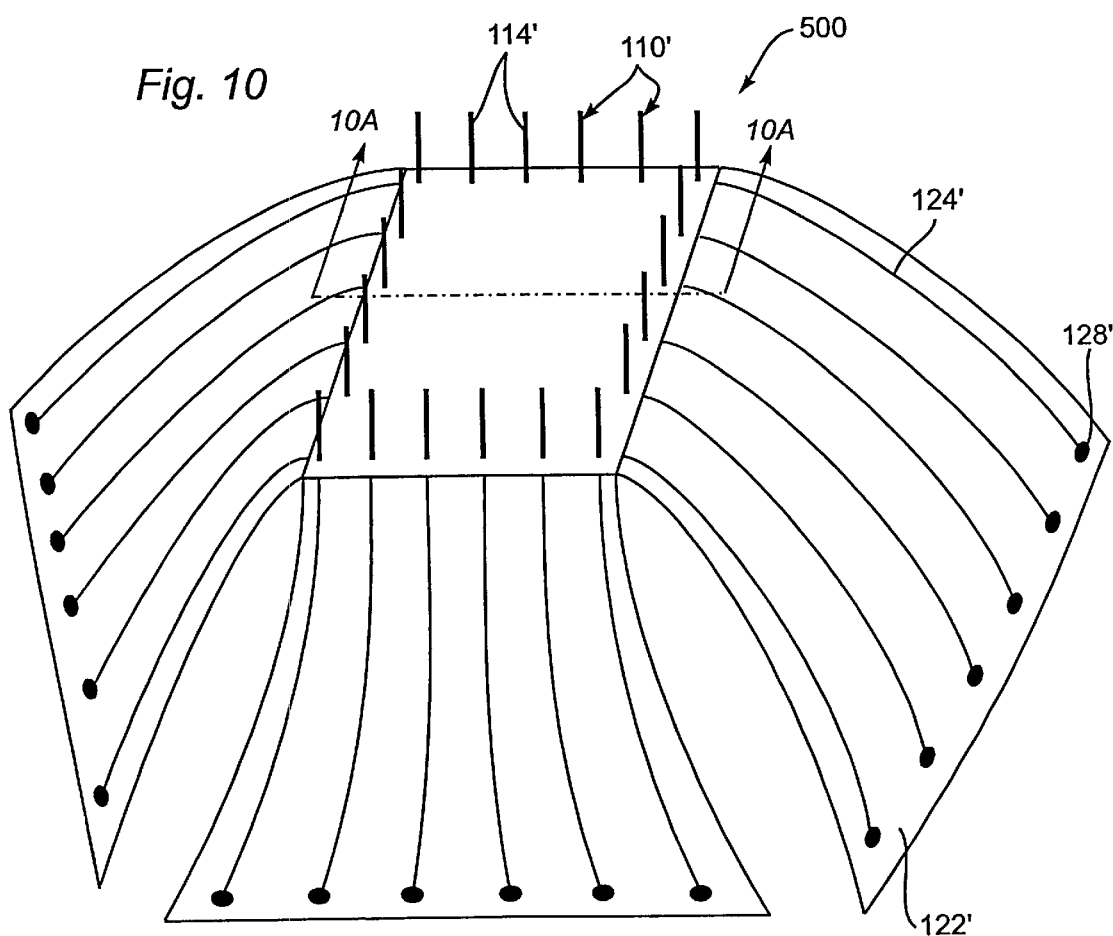
Fig. 10
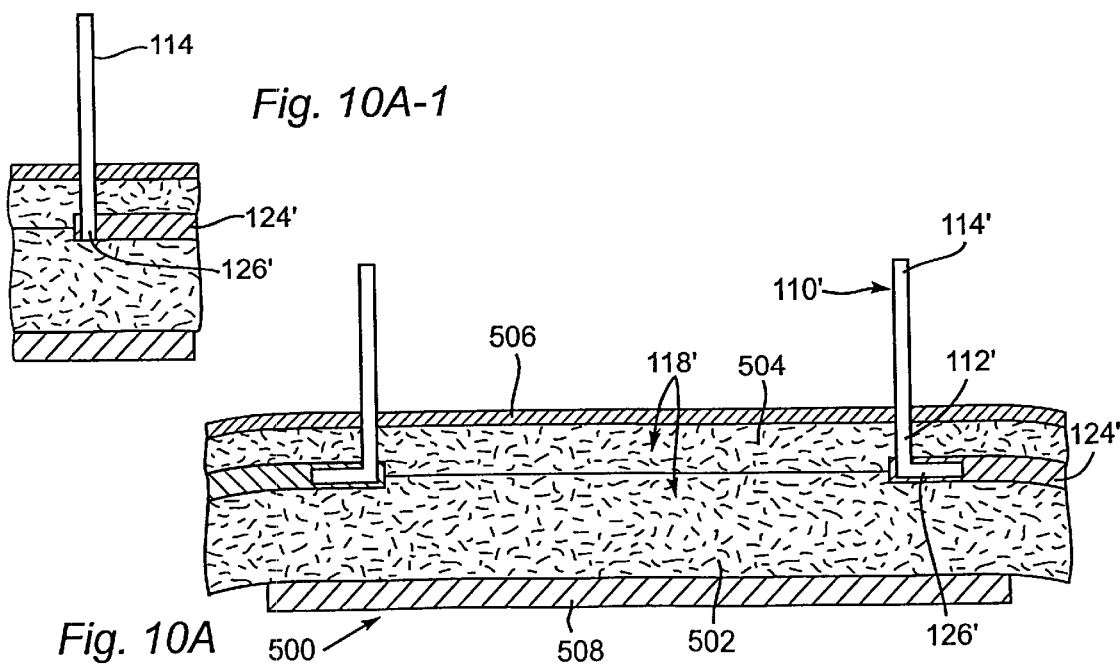
Fig. 10A-1
Fig. 10A

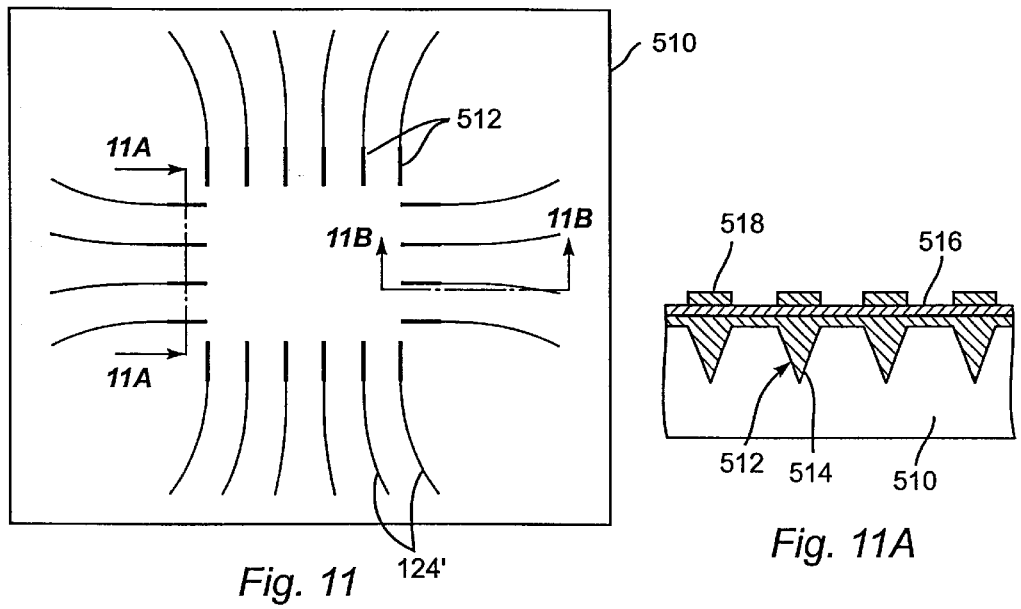
Fig. 11
Fig. 11A
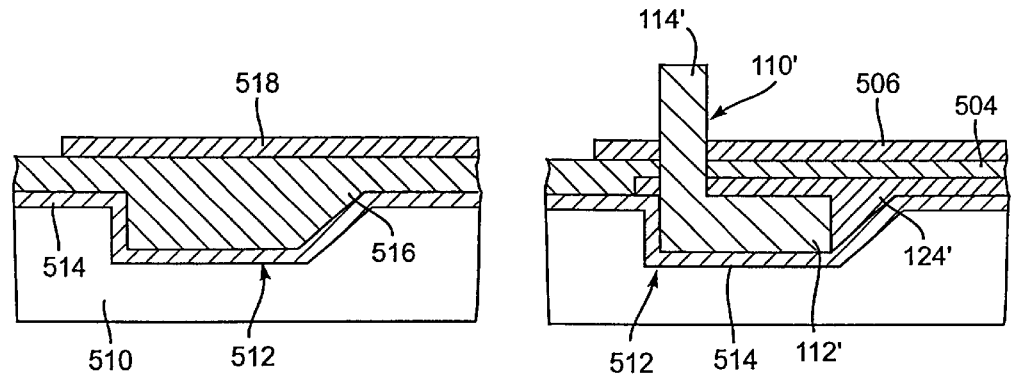
Fig. 11B-1
Fig. 11B-2
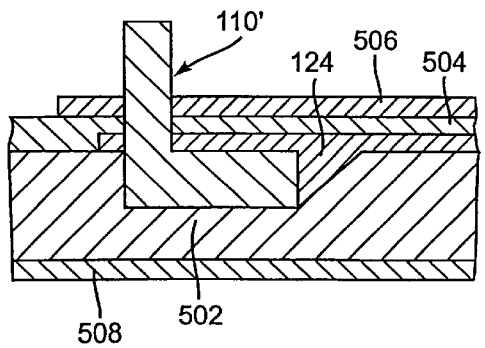
Fig. 11B-3

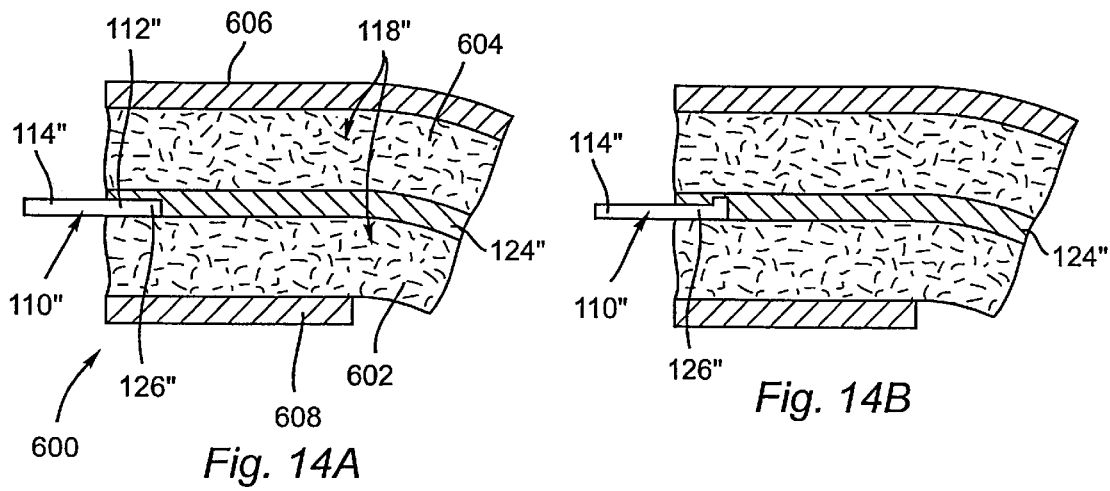
*Fig. 14A*
*Fig. 14B*
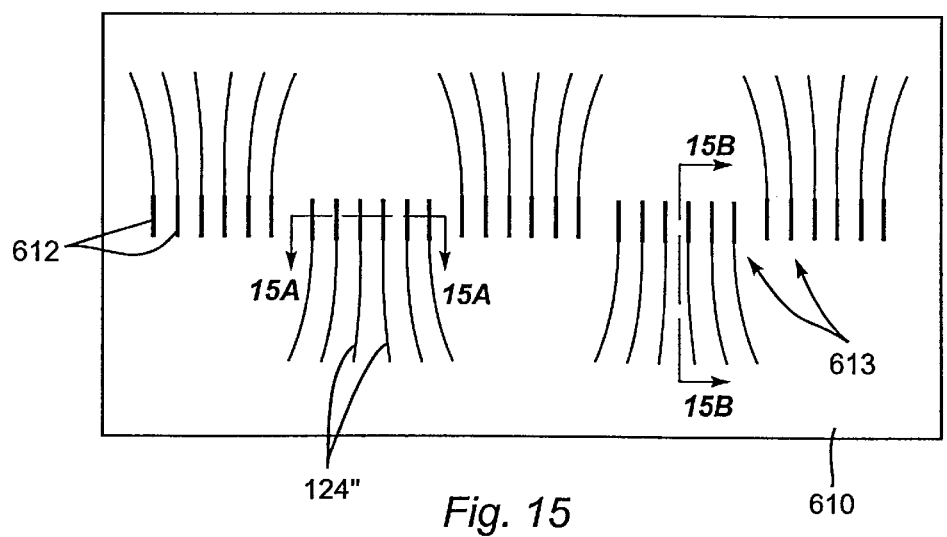
*Fig. 15*
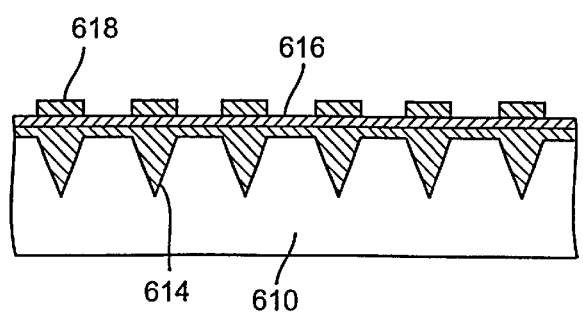
*Fig. 15A*

CUSTOMIZED ELECTRICAL TEST PROBE HEAD USING UNIFORM PROBE ASSEMBLIES

RELATED APPLICATIONS

This application is related to application Ser. Nos. 09/351,422, 09/351,427, 09/351,277, 09/352,413, 09/352,000, 09/351,278, 09/351,520, 09/351,279, 09/351,280, and 09/351,999, all expressly incorporated herein by reference and filed on the same date.

FIELD OF THE INVENTION

This invention relates to an apparatus for testing the electrical characteristics of an electrical circuit, and in particular, an integrated circuit or circuit board testing assembly for providing electrical contact to a multitude of terminals on the electrical circuit.

BACKGROUND OF THE INVENTION

During the manufacturing of electrical circuits, such as, e.g., integrated circuit (IC) chips and circuit boards, it becomes necessary to test the electrical characteristics of the electrical circuit at the input/output terminals or contact pads to ensure proper functionality the circuit. In response to the ever increasing complexity and miniaturization of IC-chips and circuit boards, the number and density of circuit bond pads have increased dramatically, requiring very fine pitch testing of the circuits. The current testing methodologies have struggled to adapt to these very fine pitch testing requirements, and in fact, pose a major limitation to the evolution of more complex and smaller IC-chips and circuit boards.

One known method for testing IC-chips (whether in a packaged or bare die form) involves probing the IC-chip contact pads using cantilever probes formed on a probe card. The cantilever probes provide a temporary electrical connection between the IC-chip pads and external test circuitry. The probe card typically includes an insulating substrate, such as a glass filled plastic, with an epoxy ring disposed in the middle. The epoxy ring serves as an electrical and mechanical interface between the cantilever probes, which extend inward from the epoxy ring, and circuit traces, which array outward from the epoxy ring. The arrayed circuit traces terminate at the edges of the probe card to provide a convenient interface for electrical connection to external testing circuitry. The external testing circuitry is specifically designed and programmed to test the IC-chip. The cantilever probes have free ends that are arranged to correspond with the pads of the IC-chip to be tested. Such an arrangement typically takes the form of a hollow or filled square. The ends of the cantilever probes point downward, such that when the probe card is disposed over the IC-chip, the cantilever probe ends contact the respective IC-chip pads.

The main issue with the use of cantilever probes is the consistent and accurate registration of the cantilever probes with the contact pads of each IC-chip. If the ends of the cantilever probes are not in simultaneous and firm contact with the respective contact pads of the IC-chip, inaccuracies in the test results may occur. Simultaneous contact with the multitude of pads, which typically number in the hundreds, requires the ends of the cantilever probes to be vertically registered with the pads of the IC-chip. Thus, if the pads of the IC-chip are in a coplanar relationship, the ends of the cantilever probes should also be in a coplanar relationship. If the pads of the IC-chip are in a non-coplanar relationship (such as may be the case with bare dice), the ends of the cantilever probes should be in a matching non-coplanar relationship. Due to this stringent requirement, the cantilever probes are typically assembled onto the probe card manually. This fact, combined with the already high cost of supplying the cantilever probes (typically, $25 a piece), results in a relative extensive probe card, often exceeding $10,000.

Additionally, due to manufacturing tolerances, there is usually some vertical misregistration between cantilever probes and the respective IC-chip pads. To compensate for this misregistration, a substantial amount of downward force is applied to the cantilever probes, so that all cantilever probes, including those that are misregistered, are in firm contact with the respective IC-chip pads. A greater applied force usually provides a more reliable contact, but can also deform the contact pads in some instances. Additionally, each of these cantilever-type probe cards are typically used to test hundreds of IC-chips. The cantilever probes are, thus, prone to deformation and further misregistration caused by the repeated application of force to the cantilever probes. Thus, to prevent electrical testing failures, the cantilever probes must be manually adjusted periodically, thereby increasing the testing time and cost. In the case of severe misregistration of the cantilever probes, the cantilever-type probe card must typically undergo a substantial amount of rework and repair or be discarded all together, resulting in a great cost burden to the IC-chip industry.

Furthermore, with the increase in density and number of the IC-chip contact pads, it becomes mechanically difficult to arrange a large number of cantilever probes within a limited space of a probe card. This becomes especially difficult when the input/output terminals take the form of bumps disposed not only on, but also disposed inside the periphery of the IC-chip, such as, e.g., with a ball grid array or flip chip. Additionally, pivoting action of the cantilever probes displaces the ends of the cantilever probes in the X-Y plane, thereby requiring a higher degree of pointing accuracy. Cantilever probe technology makes very fine pitch testing of IC's either cost prohibitive or technically unfeasible, and thus the conventional use of cantilever probe technology has now reached its limit.

In response to the afore-mentioned problems with cantilever-type probe cards, the industry has turned to membrane-type probe cards, which typically include a membrane formed of a thin and flexible dielectric material, such as polyimide. Contact bumps are plated onto the membrane in electrical communication with conductive traces, and the conductive traces electrically connect to external test circuitry. The membrane-type probe card is stretched over a solid support. A cushioning member, which absorbs any difference between the heights of the IC-chip bond pads, is disposed between the membrane-type probe card and the support. The membrane-type probe card and frame are made vertically movable so as to bring the contact bumps into elastic contact with the IC-chip bond pads.

Like the cantilever probes described above, a substantial amount of force is required to place the contact bumps in firm contact with the respective IC-chip contact pads. As a result, the contact bumps, which are typically formed of a soft-plated metal, are prone to breaking off or wearing down after several uses. Once a bump is broken or worn, the entire probe card needs to be replaced. In addition, the membrane is repeatedly stressed by large forces, causing the membrane to lose its resiliency.

Another drawback is that bump plating technology is a two-dimensional approach and is limited by current bump-plating dynamics. Thus, membrane-type probe cards cannot be used to test components that do not have coplanar testing surfaces. Still another drawback is that the number of pitch of the contact bumps are limited by the current fine line imaging technology used to form the conductive traces leading to the contact bumps. This is especially true when several rows of contact bumps are desired, thereby requiring interlacing of the conductive traces.

And still another drawback is that conventional membrane-type probe cards pose cleanliness problems when testing IC dice. Membrane-type probe cards typically have a large surface area near the wafer during probing. This area often drapes or droops into contact with wafer areas adjacent to the die under test. Membrane-type probe cards dislodge wafer process particles, which cantilever-type probe cards previously did not touch.

One known method for testing circuit boards involves column testing, i.e., placing a multitude of vertically arranged rigid pins in contact with contact pads on the circuit board. One column testing methodology, called "grid testing," uses a multitude of horizontally arranged plates with holes disposed therethrough. The holes of the top plate are arranged in a roughly pitched grid allowing ease of connection between the top ends of the pins and external test circuitry. The holes of the lower plates are used to thread the pins from the top plate to the finely pitched contact pads of the circuit board. Application of pressure on the top ends of the pins places the bottom ends of the pins in firm contact with the respective contact pads of the circuit board.

The ability to test fine pitch circuit boards using the "grid testing" methodology, however, is limited. Testing of very fine pitch circuit boards necessitates testing with pins having very small diameters. The respective diameters of the plate holes to which the diameters of the pins correspond, can only be drilled so small without exorbitantly increasing the cost of the test assembly. Also, because the pins must be threaded from a rough pitched area to a fine pitched area, the length of the pins must be relatively great, thereby adversely impacting the column strength required by the pins to accurately test the circuit boards.

Even if the circuit to be tested is not finely pitched, the application of pressure on the contact pads of the circuit board from relatively large diameter pins leaves undesirable "witness marks" on the contact pads, which may adversely affect subsequent bonding between a terminal wire and the contact pad. Furthermore, repeated longitudinal movement of the deflected pins through the plate holes wears down the holes, ultimately requiring costly replacement of the plates.

Another column testing methodology, called "dedicated wired spring probe testing," uses a multitude of relatively short pins with springs arranged to correspond to the respective contact pads of the circuit board to be tested. The springs provide resiliency to the pins, allowing the bottom ends of the pins to be placed firmly in contact with the IC-chip bonds pads when pressure is applied to the top ends of the pins. Fine pitch testing, however, requires a large number of costly pins with springs.

Very pitch circuit boards can theoretically be testing using a "flying probe," which involves automatically testing one or more contacts of the circuit board at a time with a moving probe. After each contact pad test, the "flying probe" moves onto the next contact pad. This method, however, is time consuming (taking several hours) and is not always reliable.

Accordingly, a more reliable, efficient, and less expensive apparatus for testing electrical circuits, such as IC-chips and circuit boards, is desired.

SUMMARY OF THE INVENTION

In accordance with the present inventions, an improved method of manufacturing an electrical test probe head for testing electrical circuits, such as, e.g., IC-chips and circuit boards, is provided. The electrical test probe head can be employed in circuit testers, such as, e.g., circuit board testers and probe cards, to provide an electrical connection between the terminals of the circuit to be tested and external test circuitry.

A method of manufacturing the test head includes selecting an electrical circuit having terminals arranged in a terminal pattern. Vertical probe pitch series sets are provided, each of which includes electrically conductive rigid pins, which are made of a suitable material, such as, e.g., tungsten. Each of the rigid pins has a pin shaft and a pin contact tip. The contact tips are arranged in a rectilinear pin pattern having a uniform pitch ratio. The vertical probe series further includes a registration medium, which encapsulates at least a portion of each of the pin shafts. The pin contact tips are left exposed and extend from the respective pitch series sets, so that the pin contact tips can be placed in contact with the terminals of the circuit. The pitch series sets are arranged and affixed with respect to each other, wherein the pin contact tips are configured in a pin pattern corresponding to the terminal pattern.

In the preferred method of affixing the pitch series sets with respect to each other, the spaces between the arranged pitch series sets are filled with an encapsulating medium. Alternatively, a fixture can be provided, wherein the fixture includes cavities in which the respective pitch series sets can be disposed.

BRIEF DESCRIPTION OF THE DRAWINGS

The drawings illustrate both the design and utility of preferred embodiments of the present invention, in which:

FIG. 10 is a perspective view of a horizontal probe assembly that can be employed to form a test head;

FIG. 10A is a cross-sectional view of the horizontal probe assembly of FIG. 10 taken along the line 10A—10A;

FIG. 10A-1 is a cross-sectional view of an alternative embodiment of the horizontal probe assembly of FIG. 10 taken along the line 10A—10A.

FIG. 11 is a plan view of a mandrel used to manufacture the horizontal probe assembly of FIG. 10;

FIG. 11A is a cross-sectional view of a slot formed in the mandrel of FIG. 11 taken along the line 11A—11A, wherein a step in the manufacturing process is described;

FIGS. 11B-1–11B3 are cross-sectional views of a slot formed in the mandrel of FIG. 11 taken along the line 11B—11B, wherein several steps in the manufacturing process are described;

FIG. 14A is a cross-sectional view of the vertical probe pitch series of FIG. 14 taken along the line 14A—14A;

FIG. 14B is a cross-sectional view of an alternative embodiment of the vertical probe assembly of FIG. 14 taken along the line 14A—14A.

FIG. 15 is a plan view of a mandrel used to manufacture sets of vertical probe pitch series;

FIG. 15A is a cross-sectional view of a slot formed in the mandrel of FIG. 15 taken along the line 15A—15A, wherein a step in the manufacturing process is described;

FIGS. 15B-1–15B3 are cross-sectional views of a slot formed in the mandrel of FIG. 15 taken along the line 15B—15B, wherein several steps in the manufacturing process are described;

DETAILED DESCRIPTION OF THE INVENTION

Figure 1:
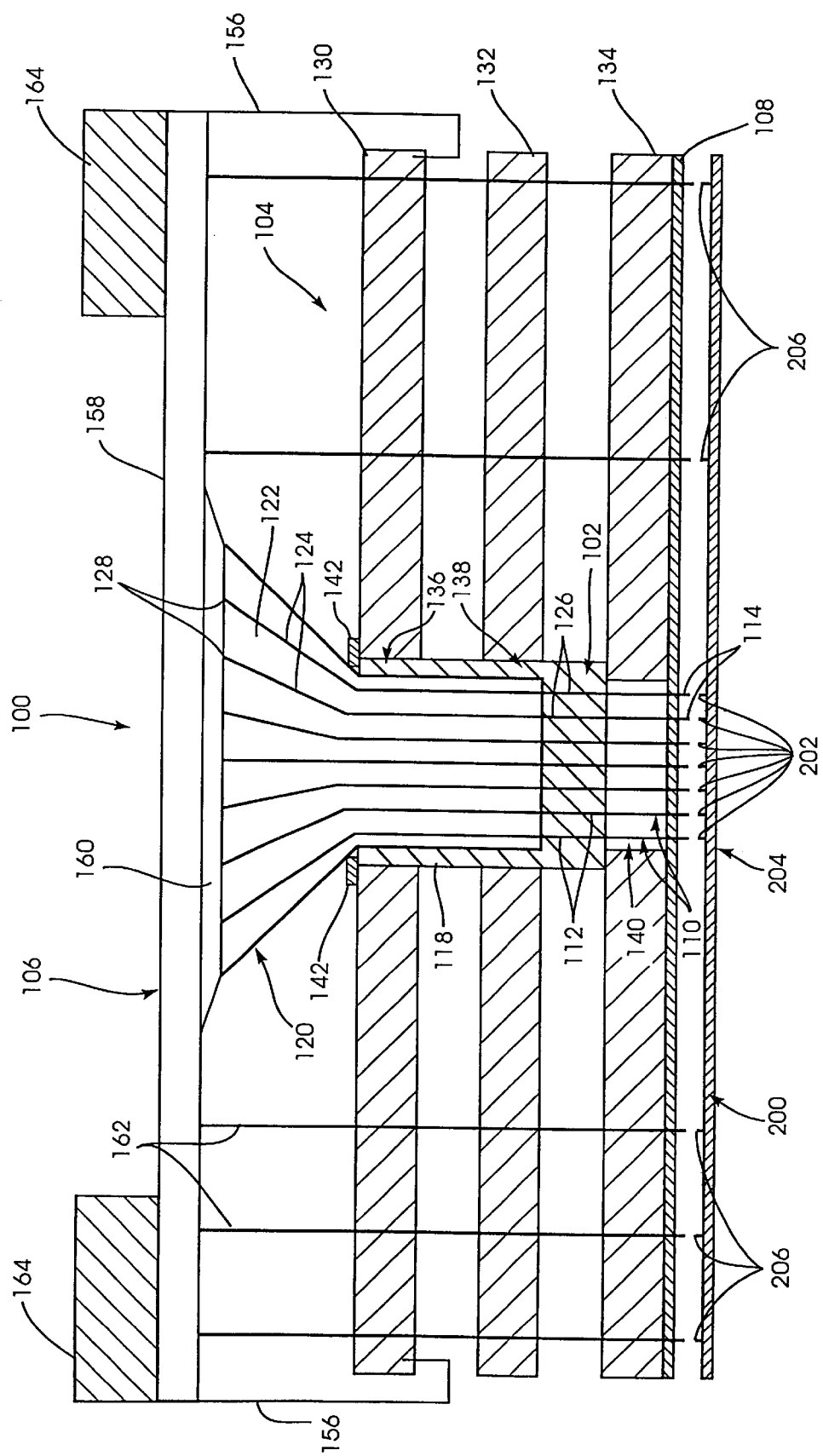
FIG. 1 is a cross-sectional view of a circuit board tester constructed in accordance with the present invention.

Referring to FIG. 1, a preferred embodiment of a circuit board tester 100 can be employed to test the electrical characteristics of a circuit board 200. The circuit board 200 can take the form of a variety of electrical structures, such as, e.g., fine pitch flexible printed circuit boards, fine pitch rigid printed circuit boards, high density interconnect, assembled fine pitch circuit boards (i.e., flexible or rigid circuit boards with integrated circuit chips), stand-alone test fixtures, etc. The circuit board 200 includes a first plurality of terminals 202, and in this case, bond pads. The circuit board terminals 202 are arranged in a fine pitch terminal pattern 204 (i.e., a pattern having a pitch ratio equal to or less than 0.010). It should be noted, however, that the present invention can be used to test a circuit board having terminals with any pitch ratio without straying from the principles taught by this invention. As will be described in further detail below, the present invention can be used to simultaneously test terminals that arranged in a non-coplanar relationship with each other, whether the terminal pattern be fine pitched or rough pitched. Moreover, the present invention can be used to test terminals, regardless of the pitch ratio, to minimize "witness marks" made on the terminals.

The fine pitch terminal pattern 204 can take the form of a variety of geometric patterns. For example, FIGS. 2 and 3 respectively depict the fine pitch terminal pattern 204 in the form of a peripheral terminal pattern 204' and a two-dimensional peripheral terminal pattern 204". The circuit board 200 has another plurality of terminals 206, which are arranged in a standard pitch terminal pattern (i.e., a pattern having a pitch ratio equal to or greater than 0.025 inches.) Of course, terminals on the circuit board may not be disposed in a well-defined pattern. The terminals 206 are typically tested by standard testers, such as, by "grid testing" and "dedicated wire spring probe testing." For the sake of completeness, however, these terminals 206 are shown.

Figure 4:
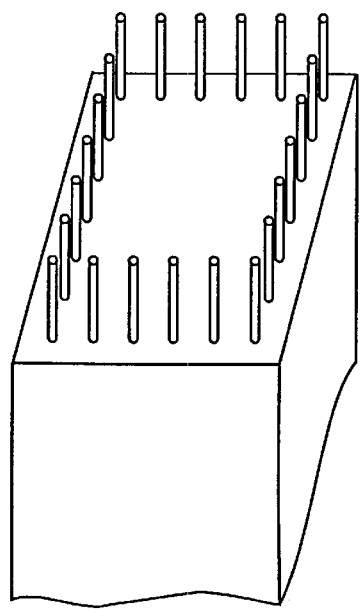
FIG. 4 is a perspective view of a test head employed in the circuit board tester of FIG. 1, wherein pin contact tips of the test head are particularly shown arranged in a pin pattern corresponding to the terminal pattern of FIG. 2.
Figure 5:
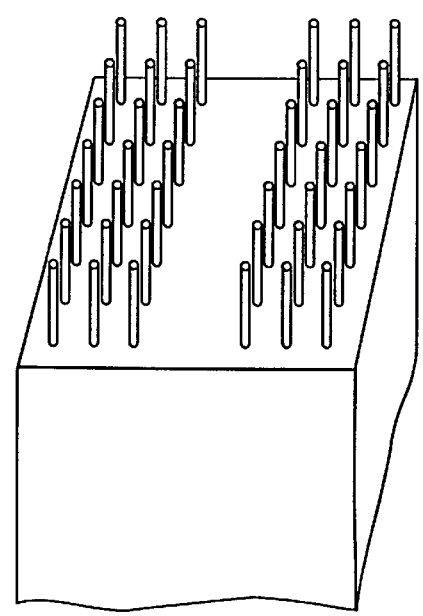
FIG. 5 is a perspective view of another test head employed in the circuit board tester of FIG. 1, wherein pin contact tips of the test head are particularly shown arranged in a pin pattern corresponding to the terminal pattern of FIG. 3.

The tester 100 includes an electrical test head 102, which provides the operative connection between the circuit board terminals 202 and the tester 100. In particular, the test head 102 includes a plurality of electrically conductive rigid pins 110, each of which includes a pin shaft 112 and a pin contact tip 114. The pin contact tips 114 are arranged in a fine pitch pin pattern 116 corresponding to the fine pitch terminal pattern 204. For example, the pin contact tips 114 can be arranged in a peripheral pin pattern 116', as depicted in FIG. 4, or a two-dimensional pin pattern 116", as depicted in FIG. 5. The rigid pins 110 are preferably composed of a material that provides the rigid pins 110 with high column strength and high electrical conductivity. In this manner, the rigid pins 110 will resist bending when the pin contact tips 114 are placed in firm contact with the circuit board terminals 202, while also serving as a sufficient electrical conduit between the circuit board terminals 202 and external testing circuitry (not shown). A material which provides high column strength and high electrical conductivity is tungsten.

The test head 102 further comprises a registration medium 118, which encapsulates a portion or the entirety of each of the pin shafts 112, thereby providing stability to the rigid pins 110. In general, the greater the area covered by the fine pitch pin pattern 116, the greater the length of the pins shafts 112 are encapsulated to maximize the stability of the rigid pins 110. The registration medium 118 is composed of a compliant adhesive, such as, e.g., silicone. In this manner, the pin contact tips 114 self-adjust to the circuit board terminals 202, thereby compensating for any vertical misregistration between the pin contact tips 114 and the circuit board terminals 202 when the pin contact tips 114 are placed in contact with the circuit board terminals 202. Thus, the registration medium 118 ensures simultaneous and firm contact between the pin contact tips 114 and the circuit board terminals 202.

The test head 102 further includes an intermediate conductive structure 120 for electrically coupling the rigid pins 110 to external test circuitry (not shown). In the illustrated embodiment, the intermediate conductive structure 120 comprises a flexible circuit 122 having a plurality of electrically conductive leads 124 respectively affixed to the rigid pins 110, and in particular, to shaft ends 126 of the rigid pins 110 opposite the respective pin contact tips 114. The conductive leads 124 are preferably composed of a highly conductive material, such as, e.g., copper. The electrically conductive leads 124 array out from the finely pitched rigid pins 110 to roughly pitched terminals 128. Thus, the intermediate conductive structure 120 provides a convenient means for electrical connection to the finely pitched rigid pins 110. The use and manufacture of flexible circuits is well known in the art of circuit testing, and will thus not be described in detail herein. The intermediate conductive structure 120 may contemplate the use of structure other than flexible circuits 122, and thus, other methods and devices may be used as a means of providing an electrical connection to the rigid pins 110 without straying from the principles taught by this invention.

In the illustrated embodiment, the test head 102 is formed into a solid or hollow cube (best shown in FIGS. 4 and 5). Thus, the periphery of the test head 102 is square. The test head 102, however, can be formed into a variety of shapes, which may be dictated by the geometry of the fine pitch terminal pattern 204. Details regarding the manufacture of the test head 102 will be described in further detail below.

The tester 100 further includes an electrical test fixture 104 to which the test head 102 is mounted. In particular, the electrical test fixture 104 comprises a plurality of parallel testing plates. In the illustrated embodiment, a top plate 130, middle plate 132, and bottom plate 134 are provided. The testing plates can be formed of any rigid workable material, such as, e.g., acrylic. The plates include respective cutouts 136, 138, and 140 for mounting the test head 102 therein. In particular, the periphery of the top and bottom cutouts 136 and 138 substantially conform to the periphery of the test head 102. Preferably, some space is provided between the periphery of the test head 102 and the periphery of the cutouts 136 and 138 to allow for fine adjustments of the test head 102, as will be described in further detail below.

The periphery of the bottom cutout 140 is smaller than the periphery of the test head 102, but large enough to allow the pin contact tips 114 to extend therethrough. In this manner, the bottom surface of the test head 102 rests on the top surface of the bottom plate 134. Test head connectors 142 are provided to firmly seat the test head 102 within the electrical fixture 104. In particular, each of the test head connectors 142 includes a rigid flange that is mounted, such as by bonding, to the top surface of the top plate 130, such that the top surface of the test head 102 abuts the bottom surface of the rigid flange. In this manner, the test head 102 is fixed in the vertical plane (i.e., the plane perpendicular to the test plane) when the pin contact tips 114 are placed into firm contact with the circuit board terminals 202.

Figure 6:
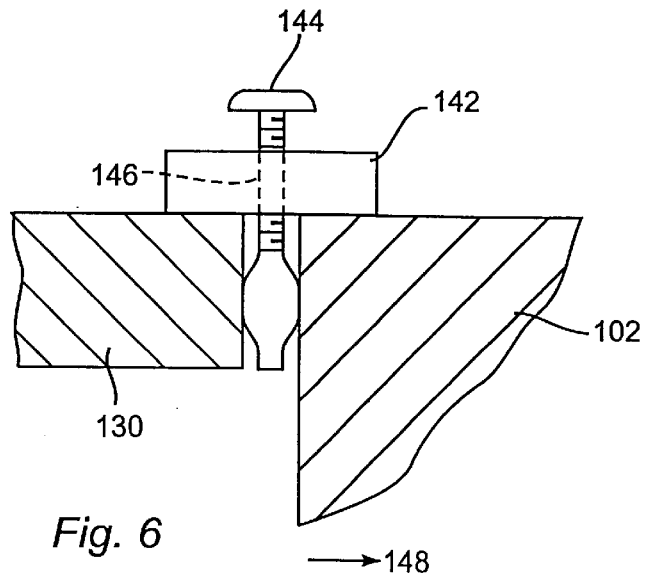
FIG. 6 is a front view of a fine adjustment mechanism employed in the circuit board tester of FIG. 1 to adjust the positioning of the test head to a first position.
Figure 7:
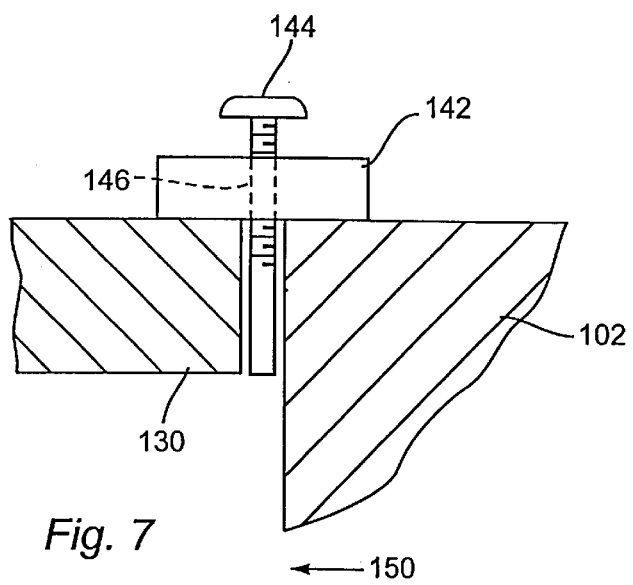
FIG. 7 is a front view of the fine adjustment mechanism of FIG. 6, wherein the test head is in a second position.

A plurality of fine adjustment mechanisms 144 are provided to finely adjust the positioning of the test head 102. As best shown in FIGS. 6 and 7, the fine adjustment mechanism 144 are oblong high pitch screw cams affixed to the test head connector 142 through screw holes 146. Rotation of each of the screw cams 144 adjusts the positioning of the test head 102 in the horizontal plane (i.e., the plane parallel to the test surface plane) between a displacement in a first direction (shown by arrow 148 in FIG. 6) and a displacement in a second direction (shown by arrow 150 in FIG. 7).

Figure 8:
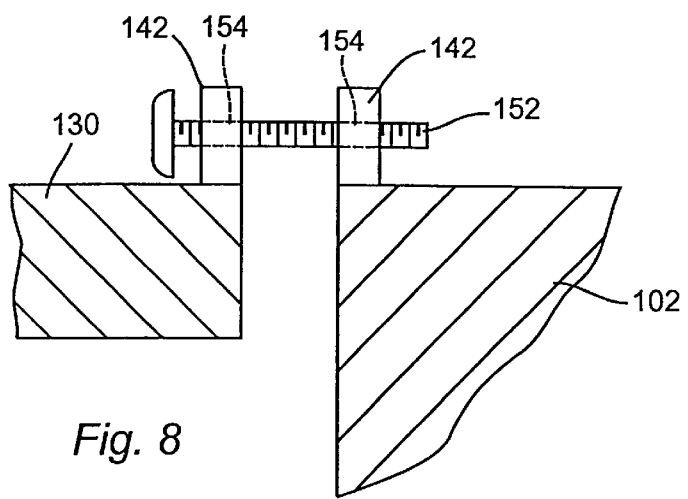
FIG. 8 is a front view of another fine adjustment mechanism employed in the circuit board tester of FIG. 1 to adjust the positioning of the test head.

Alternatively, each of the test head connectors 142 comprises a pair of rigid flanges 142 that are respectively mounted, such as by bonding, to the top surface of the top testing plate 130 and the top surface of the test head 102. A fine adjustment mechanism 152, and in this case, a high pitch standard screw, is disposed through screw holes 154 provided in the pair of rigid flanges 142 to each other, as depicted in FIG. 8. Rotation of each of the screw 152 adjusts the positioning of the test head 102 in the horizontal plane.

The tester 100 further includes a rough pitch connector 106 mounted to the electrical fixture 104, and in particular, to the top plate 130 via clamps 156. In the illustrated embodiment, the rough pitch connector 106 includes a tester grid 158, providing a testing interface between the external test circuitry (not shown) and the tester 100. The rough pitch connector 106 is electrically coupled to the intermediate conductive structure 120 through an adapter 160, which is in turn electrically coupled to the terminals 128 of the intermediate conductive structure 120. If the intermediate conductive structure 120 takes the form of a flexible circuit, the adapter 160 will be a standard flexible circuit connector.

The tester 100 further includes an aperture film 108 bonded to the electrical fixture 104, and in particular to the bottom surface of the bottom testing plate 134. The aperture film 108 includes holes (not shown) arranged in a pattern corresponding to the fine pitch terminal pattern 204. The pin contact tips 114 are respectively disposed through the aperture holes, thereby ensuring positional accuracy of the pin contact tips 114 in the horizontal plane. In this connection, the aperture film 108 is preferably composed of a suitable material that is flexible, yet able to resist tensile forces, such as, e.g., polyimide, epoxy resin, or acetate film. The thickness of the aperture film is preferably between 0.002 and 0.010 inches.

The tester 100 further includes a plurality of standard pins 162 mounted to the electrical fixture 104, and in particular, disposed through holes drilled in the respective testing plates 130, 132 and 134. The standard testing pins 162 are arranged in a pattern corresponding to the rough pitch terminal pattern.

The tester 100 additionally includes a pair of tester rams 164 for controlling vertical movement of the electrical fixture 104. Of course, depending on the tester 100, more or less tester rams 164 can be provided. The tester rams 164 are mounted to the grid plate 158 by conventional means, such as, e.g., screws. The tester rams 164 are mechanically coupled to a test machine (not shown), the operation of which alternately places downward pressure and upward pressure on the tester rams 164. Thus, the pin contact tips 114 of the test head 102 can be placed into firm contact with the circuit board terminals 202, the circuit board 200 can be tested. After the circuit board 200 is tested, the pin contact tips 114 of the test head 102 can then be removed from the circuit board terminals 202, and the tested circuit board 200 can be replaced with a like circuit board for testing.

Figure 9:
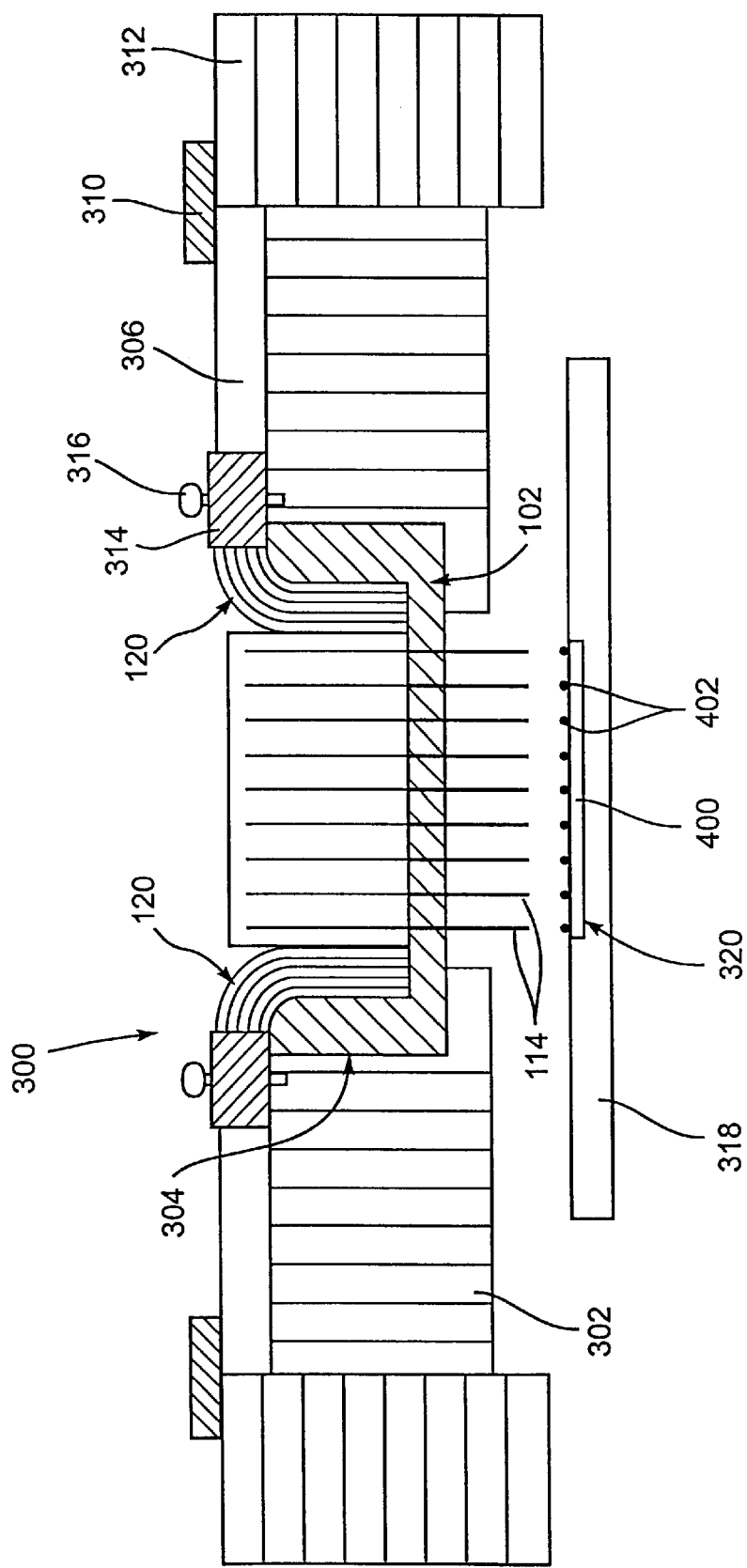
FIG. 9 is a cross-sectional view of a probe card constructed in accordance with the present invention.

Referring to FIG. 9, a preferred embodiment of a probe card 300 can be employed to test the electrical characteristics of an integrated circuit chip ("IC-chip") 400 and similar devices, such as, a ball grid array, a micro ball grid array or a chip scale package. The circuit board 400 includes a first plurality of terminals 402. The IC-chip terminals 402 are arranged in a fine pitch terminal pattern similar to the terminal patterns of the circuit board 200 shown in FIGS. 2 and 3. It should be noted, however, that the present invention can be used to test an IC-chip having terminals with any pitch ratio without straying from the principles taught by this invention. As will be described in further detail below, the present invention can be used to simultaneously test terminals that arranged in a non-coplanar relationship with each other, whether the terminal pattern be fine pitched or rough pitched. Moreover, the present invention can be used to test terminals, regardless of the pitch ratio, to minimize "witness marks" made on the terminals.

The probe card 300 comprises the electrical test head 102, including the intermediate conductivity device 120, which provides the operative connection between the IC-chip terminals 402 and the probe card 300. The probe card 300 further includes a probe card jig 302 for mounting of the test head 102. In particular, the probe card jig 302 includes a center cavity 304 in which the test head 102 is firmly seated. The probe card 300 further includes a standard printed circuit board 306, either flexible or rigid, which is disposed on the top surface of the probe card jig 302.

A standard connector ring 310, such as, e.g., a Mohr ring, bridges the electrical traces (not shown) on the printed circuit board 306 to electrical traces (not shown) on a tester mounting jig 312. The probe card 300 further includes a test head connector 314, which is mounted to the probe card jig 302 via screws 316. The test head connector 314 is electrically coupled to the electrical traces on the printed circuit board 306, and provides a connection to the test head 102 via the intermediate conductivity device 120 device, which in this case is a flexible circuit. The test head connector 314 provides the additional function of firmly mounting the test head 102 within the probe card jig 302.

The IC-chip 400 rests in cavity 320 of a press plate 318. The press plate 318 can be operated to vertically move the IC-chip 400 upwards to place the pin contacts 114 of the test head 102 into firm contact with the IC-chip terminals 402. After testing, the press plate 318 can then be operated to vertically move the IC-chip 400 vertically downwards to remove the pin contacts 114 of the test head 102 from the IC-chip terminals 402, so that the tested IC-chip 400 can be replaced with a like untested IC-chip 400.

Referring to FIG. 10, a construction of a horizontal probe assembly 500, which can be used to form the test head 102, is described. The horizontal probe assembly 500 comprises a plurality of angled rigid pins 110', each of which includes a pin shaft 112' and a pin contact tip 114'. In the illustrated embodiment, the pin contact tips 114' are each 0.100 inches long and 0.002 inches in diameter. The rigid pins 110' are arranged in a pin pattern corresponding to the pattern in which the terminals of the device to be tested is configured. For example, in the embodiment illustrated in FIG. 10, the pin contacts 114' are arranged in a peripheral pattern.

Referring to FIG. 10A, the pin shafts 112' are encapsulated by a registration medium 118', which takes the form of a top compliant layer 502 and a bottom compliant layer 504. As discussed above, the registration medium 118' can be composed of silicone, and provides stability and compliance to the rigid pins 110'. In the illustrated embodiment, the top compliant layer 502 is 0.030 inches thick and the bottom compliant layer 504 is 0.010 inches thick. The rigid pins 110' each comprises a shaft end 126', which is affixed to an electrically conductive lead 124'. As will be discussed in further detail below, the shaft ends 126' are respectively plated onto the electrically conductive leads 124' via a fine line imaging process. As depicted, the pin contact tips 114' extend perpendicular to the laminar plane, and in particular, the plane in which the electrically conductive leads 124' are disposed. It should be noted that a "horizontal" probe assembly is characterized by this feature, and the use of a angled rigid pin is one way of implementing a horizontal probe assembly.

The horizontal probe assembly 500 includes a carrier layer 506 disposed over the bottom compliant layer 504. The carrier layer 506 is preferably composed of a suitable material that is flexible, yet able to resist tensile forces, such as, e.g., polyimide, epoxy resin, or acetate film. In the illustrated embodiment, the carrier layer 506 is 0.002 inches thick. The carrier layer 506 provides positional accuracy of the pin contact tips 114'. Thus, if the horizontal probe assembly 500 is employed in the test head 102 of the circuit board tester 100, the carrier layer 506 can either replace or supplement the aperture film 108.

As depicted in FIG. 10, each of the pin contact tips 114' extend through the bottom compliant layer 504 and carrier layer 504. Thus, when the pin contact tips 114' are placed in firm contact with the terminals of the device to be tested, the registration medium 118' provides both stability and vertical compliance. The horizontal probe assembly 500 further includes a stiffening plate 508 disposed on the top compliant layer 502 opposite the carrier layer 506. The stiffening plate 508 is composed of a suitable rigid material, such as, e.g., aluminum. The stiffening plate 508 provides support to the pin shafts 126' when the respective pin contact tips 114' are placed in firm contact with the terminals of the device to be tested. That is, the stiffening plate 508 prevents the pin shafts 126' from excessively bending upward, which might otherwise result in the fracturing of the connection between the pin shafts 126' and the electrically conductive leads 124' after repeated testing.

As depicted in FIG. 10, the compliant layers 502 and 504, carrier layer 506, and electrically conductive leads 124' extend past the stiffening plate 508 to form a flexible circuit 122'. The electrically conductive leads 124' array outward from the respective pin shafts 126' to rough pitch electrical terminals 128', thereby providing a convenient interface for electrical connection to the rigid pins 110'.

In an alternative preferred embodiment, as shown in FIG. 10A-1, the rigid pin 110' of the horizontal probe assembly 500 is not angled, but is rather straight. In this embodiment, the electrically conductive lead 124' is plated onto the shaft end 112' of the straight rigid pin 110' opposite the pin contact tip 114', such as to form a T-shaped bond.

Referring to FIG. 11, a preferred method of manufacturing the horizontal probe assembly 500 is described. A stainless steel plate forms a mandrel 510 in which a plurality of slots 512 are formed. The number of slots 512 are equal to the number of rigid pins 110' to be constructed on the horizontal probe assembly 500, i.e., the number of device terminals to be tested. The slots 512, and in particular the ends of the slots 512, are arranged in a slot pattern corresponding to the pattern of the device terminals to be tested. In the illustrated embodiment, the outer ends of the slots 512 are arranged in a peripheral pattern.

Referring to FIGS. 11A and 11B-1, the surface of the mandrel 510 and slots 512 are flash plated with a material having a low affinity to the mandrel 510, such as a copper coating 514. The copper coating 514 is then coated with a photoresist 516, which is then optically exposed through a mask 518 defining a pattern of the electrically conductive leads 124'.

Figure 2:
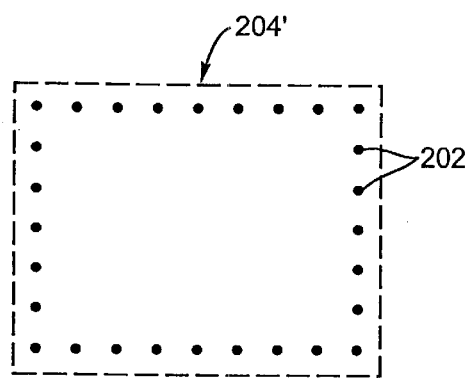
FIG. 2 is a schematic drawing of an exemplary fine pitch terminal pattern on a circuit board as might be tested by the circuit board tester of FIG. 1.

Referring to FIG. 11B-2, the mask 518, as well as the photoresist 516 that has not been polymerized, is then removed, leaving a negative pattern of the electrically conductive leads 124'. The rigid pins 110' are then placed within the respective slots 512, with the pin contacts 114' pointing out from the respective slots 512. It should be noted that the width of the slots 512 are slightly greater than the diameter of the pin shafts 126' to compensate for the narrowing of the respective slots 512 by the copper coating 514. As depicted in FIG. 11A, the cross-section of the slots 512 are preferably V-shaped to facilitate centering of the rigid pins 110' within the respective slots 512.

A second coating of electrically conductive material, such as copper, is electroplated onto the rigid pins 110' and portion of the copper coating 514 not covered by the negative pattern of the photo resist 516 to form the electrically conductive leads 124'. A coating of an etch-resistant material (not shown), such as tin or gold, is applied over the electrically conductive leads 124' to protect the electrically conductive leads 124' during the etching process.

The negative pattern of photoresist 516 and the portion of the copper layer 514 not disposed on the mandrel 510 underneath the electrically conductive leads 124' and rigid pins 110' is then stripped, via an etching process, to leave the electrically conductive leads 124', the rigid pins 110', and the portion of the copper coating 514 disposed on the mandrel 510 underneath the electrically conductive leads 124' and rigid pins 110'. The etch-resistant material can be subsequently removed, or if gold, left on the electrically conductive leads 124'. The bottom compliant layer 504 is suitably laminated to the electrically conductive leads 124', copper coating 514 and rigid pins 110'. The carrier layer 506 is then laminated over the bottom compliant layer 504.

Figure 3:
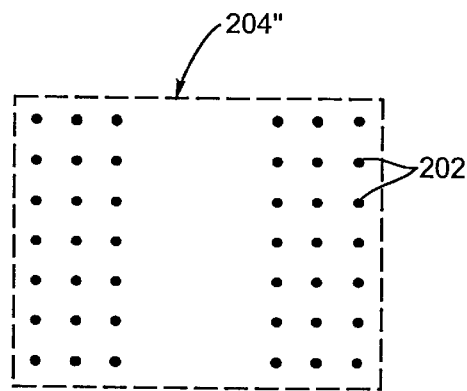
FIG. 3 is a schematic drawing of another exemplary fine pitch terminal pattern on a circuit board as might be tested by the circuit board tester of FIG. 1.

Referring to FIG. 11B-3, the assembly of electrically conductive leads 124', rigid pins 110', bottom compliant layer 504 and carrier layer 506 are lifted from the mandrel 510, facilitated by the low affinity copper coating 514. The top compliant layer 502 is then laminated to the electrically conductive leads 124' opposite the bottom compliant layer 504. The stiffening plate 508 is bonded to a portion of the top compliant layer 502 disposed over the rigid pins 110'. It should be noted that for purposes of illustration in emphasizing some of the features, these features are not shown to scale in FIGS. 11A, 11-B, 11B-2 and 11B-3. For example, the length of the thickest portion of the electrically conductive lead 124' would typically be greater than what is shown in FIGS. 11B-2 and 11B-3.

The above-described manufacturing process has been described with respect to registering the pin contact tips 114" by pointing the pin contact tips 114" upward from the slot 512. Registration of the pin contact tips 114", however, can be facilitated by providing holes in the slots 512 and disposing the pin contact tips 114 respectively therethrough. In this case, the carrier layer 506 can be applied after the assembly is removed from the mandrel 510.

It should be noted that current fine line imaging technology limits the terminal density (i.e., the number of terminals per usable area) that the horizontal probe assembly 500 can be designed for. This is because the electrically conductive leads 124' can only be imaged so fine (typically, 0.020 inches), posing a routing problem when the terminals are too dense, especially when the terminals are arranged in a two-dimensional pattern.

Figure 12:
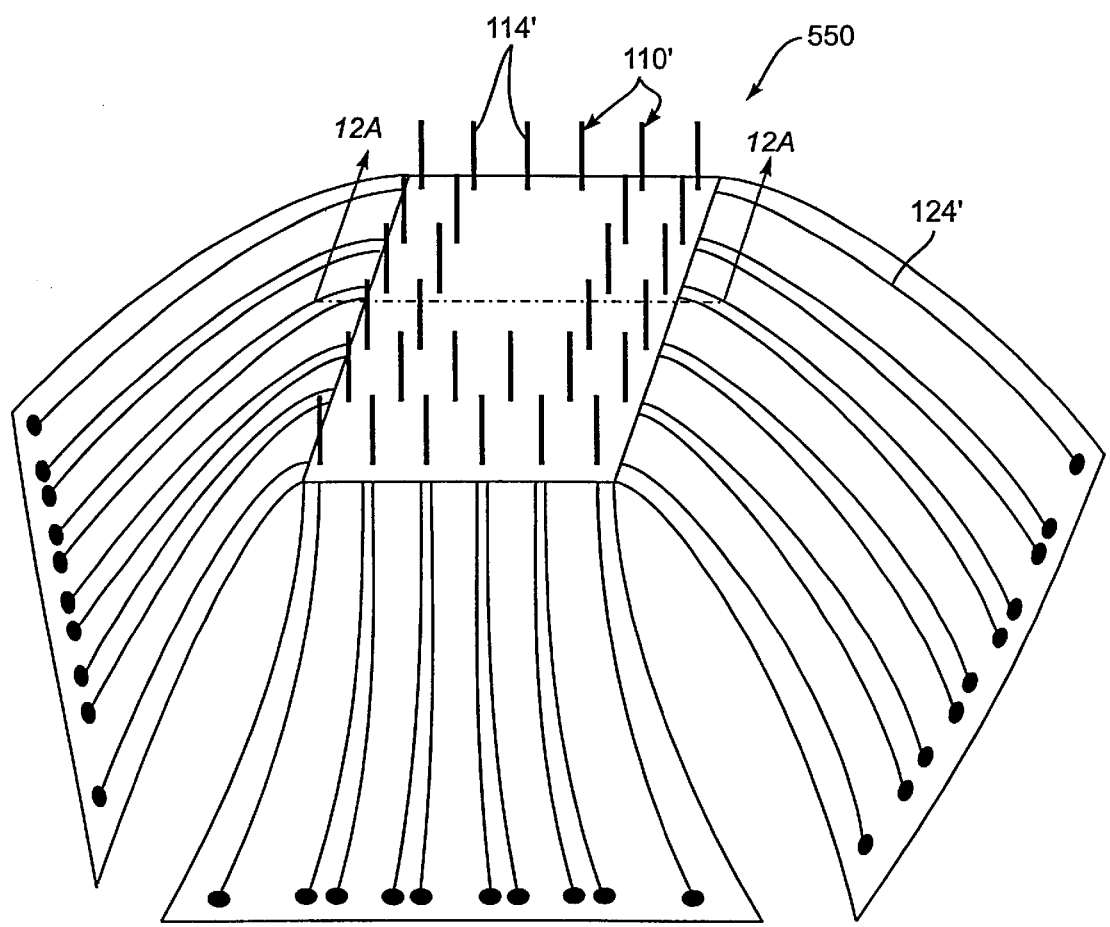
FIG. 12 is a perspective view of a multi-layer horizontal probe assembly that can be employed to form a test head.

In this connection, referring to FIG. 12, a multiple-layer horizontal probe assembly 550 is described. The structure of the horizontal probe assembly 550 is similar to that of the horizontal probe assembly 500 described above, and identical reference numbers have been given to corresponding elements. As can be seen, the pin contacts 114' are arranged in a two-dimensional pattern.

Figure 12A:
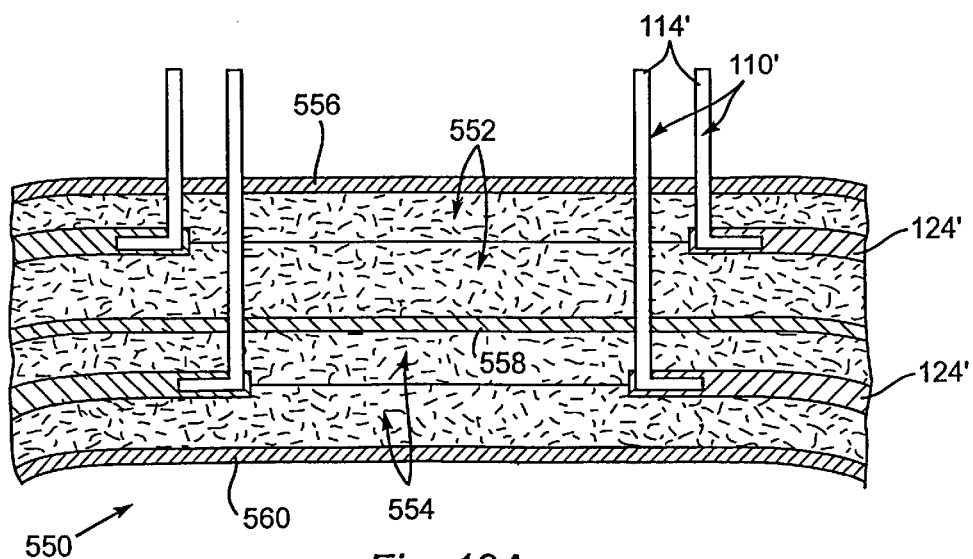
FIG. 12A is a cross-sectional view of the multi-layer horizontal probe assembly of FIG. 12 taken along the line 10A–10A.

Referring to FIG. 12A, the horizontal probe assembly 550 includes outer angled rigid pins 110' corresponding to terminals disposed on the outer periphery of the terminal pattern and inner angled rigid pins 110' corresponding to the inner periphery of the terminal pattern. The outer rigid pins 110' are encapsulated in a first registration medium 552, and the inner rigid pins 110' are disposed in first and second registration media 552 and 554. As with the registration medium 118' of the horizontal probe assembly 500 described above, the registration media 552 and 554 provide stability and compliance to the rigid pins 110'. Since the inner rigid pins 110' must travel a greater distance through the first and second registration media 552 and 554, the inner rigid pins 110' are longer than the outer rigid pins 110'.

The outer and inner rigid pins 110' are affixed to electrically conductive leads 124'. The horizontal probe assembly 550 includes a first outer carrier layer 556 disposed on the first registration medium 552, and an inner carrier layer 558 disposed between the respective first and second registration media 552 and 554. As with the horizontal probe assembly 500 described above, the outer and inner carrier layers 556 and 558 provide positional accuracy to the pin contact tips 114'. The horizontal probe assembly 550 includes a stiffening plate 560 disposed on the second registration medium 554 opposite the outer and inner carrier layers 556 and 558. As with the horizontal probe assembly 500 described above, the stiffening plate 560 provides support to the rigid pins 110' when bent in response to firm contact with the terminals of the device to be tested.

Figure 13:
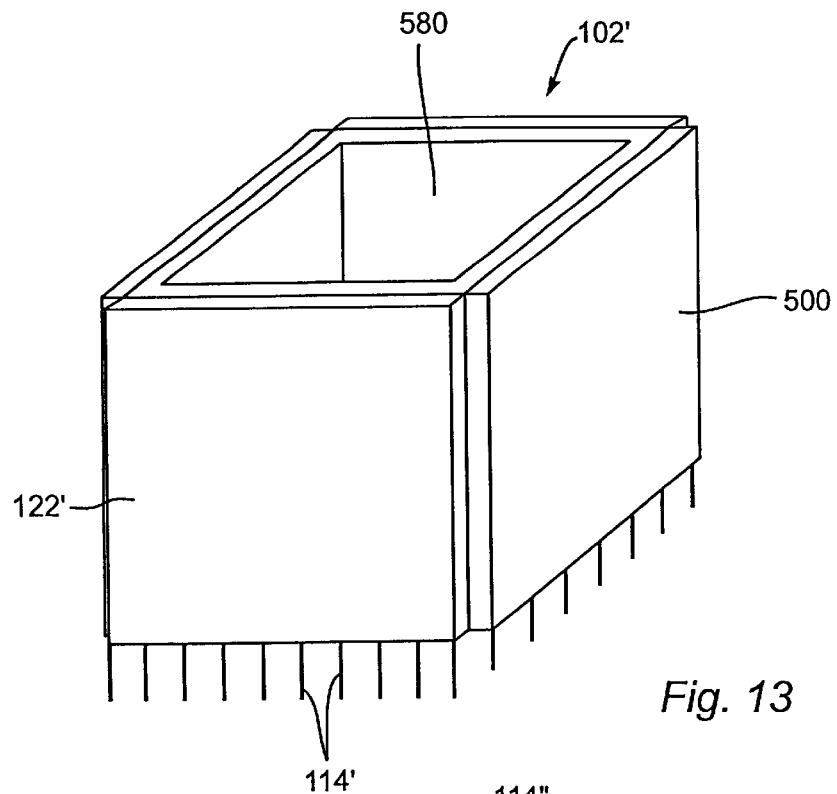
FIG. 13 is a perspective view of a test head formed by applying the horizontal probe assembly of FIG. 10 to a test head fixture.

The horizontal probe assemblies 500 and 550 can be used to form a test head 102', similar to the test head 102 described above. In particular, as depicted in FIG. 13, the horizontal probe assembly 500 can be wrapped around and bonded to a rectangular rigid test head fixture 580, such that the pin contact tips 114' are disposed on the bottom of the test head fixture 580, and the flexible circuit 122' is disposed on the four sides of the test head fixture 580. The horizontal probe assembly 550 can be similarly mounted to the test head fixture 580.

Figure 14:
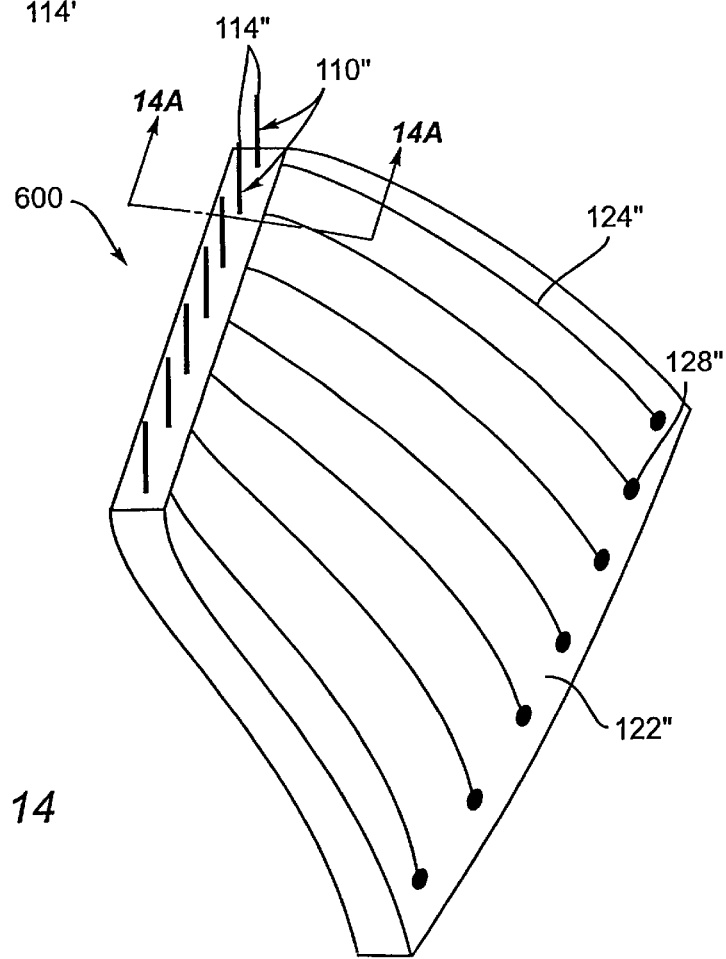
FIG. 14 is a perspective view of a vertical probe pitch series that can be employed to form a test head.

Referring to FIG. 14, a construction of a vertical probe pitch series 600, which can be used to form the test head 102, is described. The pitch series 600 comprises a plurality of straight rigid pins 110", each of which includes a pin shaft 112" and a pin contact tip 114". In the illustrated embodiment, the pin contact tips 114" are each 0.100 inches long and 0.002 inches in diameter. The rigid pins 110" are arranged in a rectilinear pin pattern having a pitch ratio equal to a multiple of the pitch ratio of the terminals of the device to be tested. For example, if the pitch ratio of the device terminals is 0.005, the pitch ratio of the pitch series can be 0.005, 0.100, etc.

The pin shafts 112" are encapsulated by a registration medium 118", which takes the form of a top compliant layer 602 and a bottom compliant layer 604. As discussed above, the registration medium 118" can be composed of silicone, and provides stability and compliance to the rigid pins 110". In the illustrated embodiment, the respective top and bottom compliant layers 602 and 604 are each 0.010 inches thick. The rigid pins 110" each comprises a shaft end 126", which is affixed to an electrically conductive lead 124". As will be discussed in further detail below, the shaft ends 126" are respectively plated onto the electrically conductive leads 124" via a fine line imaging process. As depicted, the pin contact tips 114" extend parallel to the laminar plane, and in particular the plane in which the electrically conductive leads 124" are disposed. It should be noted that a "vertical" probe assembly is characterized by this feature, and the use of a straight rigid pin is one way of implementing a vertical probe assembly.

The vertical pitch series 600 includes a carrier layer 606 disposed over the bottom compliant layer 604. The carrier layer 606 is preferably composed of a suitable material that is flexible, yet able to resist tensile forces, such as, e.g., polyimide, epoxy resin, or acetate film. In the illustrated embodiment, the carrier layer 606 is 0.002 inches thick.

As depicted in FIG. 14A, each of the pin shafts 112" are supported on both sides by respective top and bottom compliant layer 602 and 604. Thus, when the pin contact tips 114" are placed in firm contact with the terminals of the device to be tested, the registration medium 118" provides both stability and vertical compliance. Additionally, because the rigid pin 110" is straight, no bending force is applied to the connection between the pin shaft 112" and the electrically conductive lead 124" when force is applied to the pin contact tips 114". Thus, the vertical probe pitch series 600 provides a durable structure necessary for repetitive testing of circuits.

The vertical probe pitch series 600 further includes a stiffening plate 608 disposed on the top compliant layer 602 opposite the carrier layer 606. The stiffening plate 608 is composed of a suitable rigid material, such as, e.g., aluminum. The stiffening plate 608 provides additional column support to the rigid pins 110" and electrically conductive leads 124" when the respective pin contact tips 114" are placed in firm contact with the terminals of the device to be tested.

As depicted in FIG. 14, the compliant layers 602 and 604, carrier layer 606, and electrically conductive leads 124" extend past the stiffening plate 608 to form a flexible circuit 122". The electrically conductive leads 124" array outward from the respective pin shafts 126" to rough pitch electrical terminals 128", thereby providing a convenient interface for electrical connection to the rigid pins 110".

In an alternative preferred embodiment, as shown in FIG. 14A-1, the rigid pin 110" of the vertical probe assembly 500 is not straight, but is rather angled. In this embodiment, the electrically conductive lead 124" is plated onto the shaft end 112" of the angled rigid pin 110".

It should be noted that the vertical probe pitch series 600 can be generically referred to as a vertical probe assembly. The vertical probe assembly does not necessarily have pin contact tips arranged in a uniform pitch ratio, whereas the vertical probe pitch series 600 is characterized by the uniformity in the pitch ratio of the pin contact tips 114".

Figures 1, 15B:
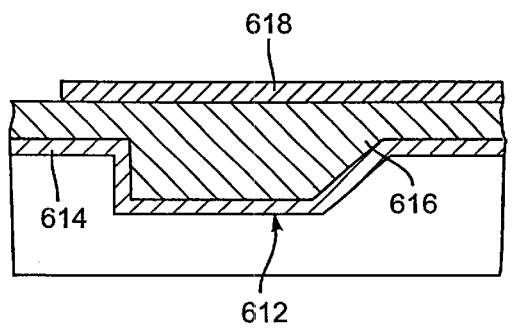
Figures 2, 15B:
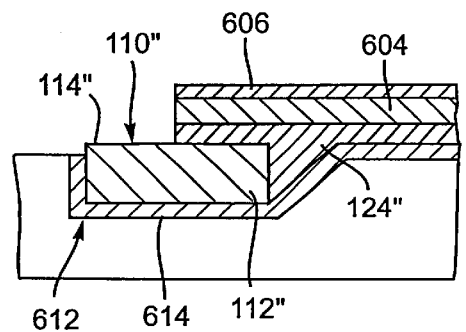
Figures 3, 15B:
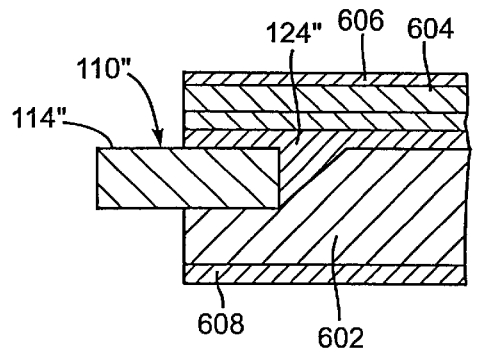

Referring to FIG. 15, a preferred method of manufacturing the vertical probe pitch series 600 is described. A stainless steel plate forms a mandrel 610 in which a plurality of slots 612 are formed. The number of slots 612 are equal to the number of rigid pins 110" to be constructed on the vertical probe pitch series 600. The slots 612 are arranged in a rectilinear slot pattern having a uniform pitch ratio equal to a multiple of the pitch ratio of the device terminals to be tested. As depicted, for efficiency and ease of manufacturing, several sets 613 of slots 612 are formed onto the mandrel 610, such that several sets of vertical probe pitch series 600 can be manufactured at one time. Preferably, the slot sets 613 are substantially centered on the mandrel. In this manner, the electrically conductive leads 124" can be plated to the rigid pins 110", such that electrically conductive leads 124" extending from each of the slot sets 613 are arranged in an interdigitized manner, as depicted in FIG. 15.

Referring to FIGS. 15A and 14-B1, the surface of the mandrel 610 and slots 612 are flash plated with a material having a low affinity to the mandrel 610, such as a copper coating 614. The copper coating 614 is then coated with a photoresist 616, which is then optically exposed through a mask 618 defining a pattern of the electrically conductive leads 124".

Referring to FIG. 15B-2, the mask 618, as well as the portion of the photoresist 616 that has not been polymerized, is then removed, leaving a negative pattern of the electrically conductive leads 124'. The rigid pins 110" are then placed within the respective slots 612. It should be noted that the width of the slots 612 are slightly greater than the diameter of the pin shafts 126" to compensate for the narrowing of the respective slots 612 by the copper coating 614. As depicted in FIG. 15A, the cross-section of the slots 612 are preferably V-shaped to facilitate centering of the rigid pins 110" within the respective slots 612.

A second coating of electrically conductive material, such as copper, is electroplated onto the rigid pins 110' and portion of the copper coating 614 not covered by the negative pattern of the photo resist 616 to form the electrically conductive leads 124". A coating of an etch-resistant material (not shown), such as tin or gold, is applied over the electrically conductive leads 124", with the exception of the electrically conductive leads 124" disposed on the pin contact tips 114", to protect the electrically conductive leads 124' during the etching process.

The negative pattern of photoresist 616 and copper layer 614, along with the unprotected copper disposed on the pin contact tips 114" are removed from the mandrel 610, via an etching process, thereby leaving the electrically conductive leads 124' and rigid pins 110' disposed on the mandrel 610. The etch-resistant material can be subsequently removed, or if gold, left on the electrically conductive leads 124". The bottom compliant layer 604 is suitably laminated to the electrically conductive leads 124' and rigid pins 110'. The carrier layer 606 is then laminated over the bottom compliant layer 604.

The assembly of electrically conductive leads 124", rigid pins 110", bottom compliant layer 604 and carrier layer 606 are lifted from the mandrel 610, facilitated by the low affinity copper coating 614 disposed on the mandrel 610 underneath the electrically conductive leads 124" and rigid pins 110". The top compliant layer 602 is then laminated to the electrically conductive leads 124" opposite the bottom compliant layer 604. The stiffening plate 608 is bonded to a portion of the top compliant layer 602. It should be noted that for purposes of illustration in emphasizing some of the features, these features are not shown to scale in FIGS. 15A, 15B-1, 15B-2 and 15B-3. For example, the length of the thickest portion of the electrically conductive lead 124" would typically be greater than what is shown in FIGS. 15B-2 and 15B-3.

The vertical probe pitch series 600 can be used in conjunction with other vertical probe pitch series to conveniently and efficiently form a customized test head 102". In this connection, several sets of vertical probe pitch series 600 can be inventoried and used subsequently as the basic building blocks for a test head.

Figure 16:
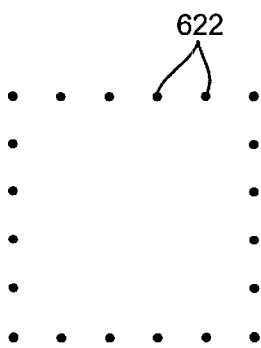
FIG. 16 is a schematic drawing of an exemplary terminal pattern on a device to be tested.
Figure 17:
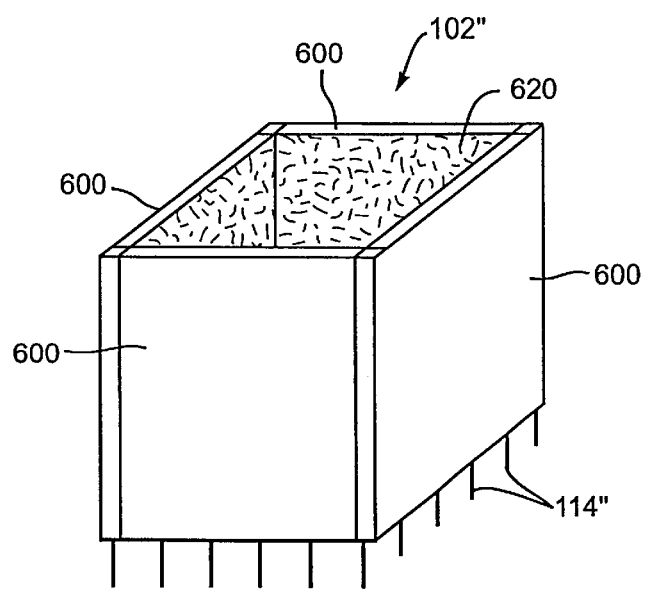
FIG. 17 is a perspective view of a test head formed by arranging sets of vertical probe pitch series of FIG. 14, wherein the pin pattern of the test head correspond with the terminal pattern of FIG. 16, and wherein the sets of vertical probe pitch series are affixed in a medium.

For example, if the terminals 622 of the device to be tested are arranged in a peripheral terminal pattern (FIG. 16), four sets of vertical probe pitch series 600 can be arranged to form the periphery of the test head 102" (FIG. 17), such that the pin contact tips 114" are arranged in a corresponding peripheral pin pattern. It should be noted that two of the vertical probe pitch series 600 have four rigid pins 110" and the other two of the vertical probe pitch series 600 have six rigid pins 110". Practically speaking, however, a vertical probe pitch series 600 will include many more rigid pins 110" when designed for fine-pitch testing. After the sets of vertical probe pitch series 600 are arranged, they are affixed in relationship with each other by filling any space within the test head 102" not occupied by a vertical probe pitch series 600 with a medium 620, such as, e.g., silicone. In this manner, the structural integrity of the test head 102" is enhanced.

Figure 18:
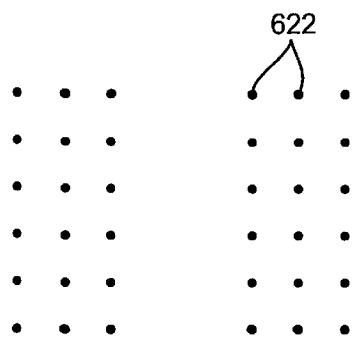
FIG. 18 is a schematic drawing of another exemplary terminal pattern on a device to be tested.
Figure 19:
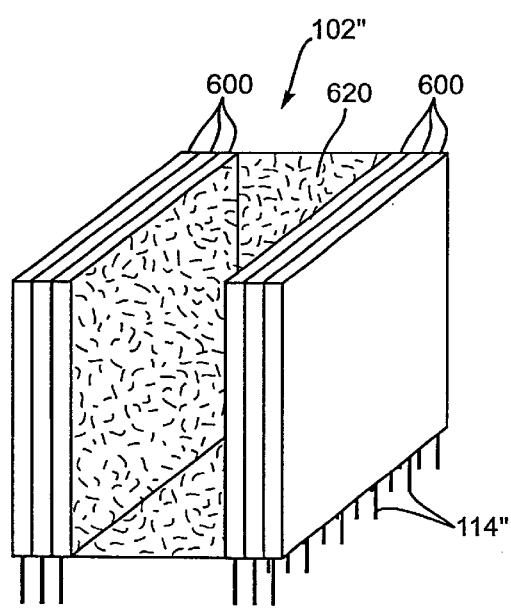
FIG. 19 is a perspective view of a test head formed by arranging sets of vertical probe pitch series of FIG. 14, wherein the pin pattern of the test head correspond with the terminal pattern of FIG. 18, and wherein the sets of vertical probe pitch series are affixed in a medium.

If the terminals 622 of the device to be tested are arranged in a two-dimensional terminal pattern (FIG. 18), a multitude of sets of vertical probe pitch series 600 can be arranged one after another (FIG. 19), such that the pin contact tips 114" are arranged in a two-dimensional pin pattern. Again, after the sets of vertical probe pitch series 600 are arranged, they are affixed in relationship with each other by filling any space within the test head 102" not occupied by a vertical probe pitch series 600 with a medium 620, such as, e.g., silicone.

It should be noted that because the set of vertical probe pitch series 600 are vertically disposed, an increase in terminal density, even with a two-dimensional terminal pattern, does not severely hamper the ability route the electrically conductive leads 124" from the rigid pins 110". Thus, the sets of vertical probe pitch series 600 can be employed to greatly enhance the ability of test head designer to route the electrically conductive leads 124".

The above examples assume that the pitch ratio of the terminal pattern is equal to the pitch ratio of the pin pattern. Sets of vertical probe pitch series 600 can be interdigitized. In this manner, sets of vertical probe pitch series 600 can be constructed, such that the pitch ratio of the pin pattern is greater than the pitch ratio of the terminal pattern. For example, sets of vertical probe pitch series 600, each constructed with a pitch ratio of 0.100 inches, can be used to design a test head to test a 0.005 pitch ratio terminal pattern. Such a feature allows facilitates plating of the electrically conductive conductors 1241" onto the respective rigid pins 110".

Figure 20:
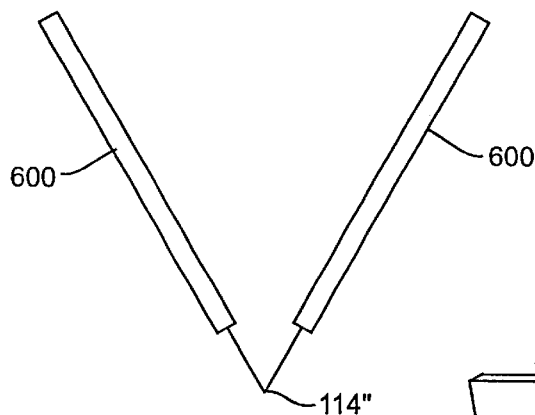
FIG. 20 is a side view of a pair of interdigitized vertical probe pitch series, wherein the combined pin pattern of the vertical probe pitch series corresponding with a rectilinear terminal pattern.
Figure 21:
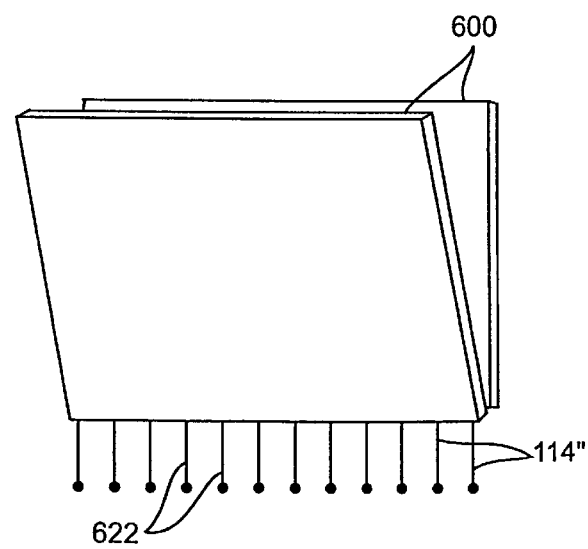
FIG. 21 is a perspective view of the pair of interdigitized vertical probe pitch series of FIG. 20.

FIGS. 20 and 21 depict a pair of interdigitized vertical probe pitch series 600 employed to test device terminals 622 arranged in a rectilinear pattern (FIG. 21). The pin contact tips 114" of each of the vertical probe pitch series are arranged in a rectilinear pattern having a pitch ratio twice as great as the pitch ratio of the rectilinear terminal pattern. As best shown in FIG. 20, the respective vertical probe pitch series are arranged in a differentially angled interdigitized manner, such that the pin contact tips 114" from each of the respective pair of vertical probe pitch series 600 alternates to create a rectilinear pin pattern corresponding to the rectilinear terminal pattern. Several pairs of interdigitized vertical probe pitch series 600 can be employed to manufacture a test head 102" that tests devices having terminals arranged in several rectilinear patterns.

It should be noted that the orientation of the pair of vertical probe pitch series 600 is not limited to the orientation depicted in FIGS. 20 and 21. Thus, one vertical probe pitch series may extend directly upward perpendicular to the test plane, and the other vertical probe pitch series may extend at an angle from the vertical probe pitch series.

Figure 22:
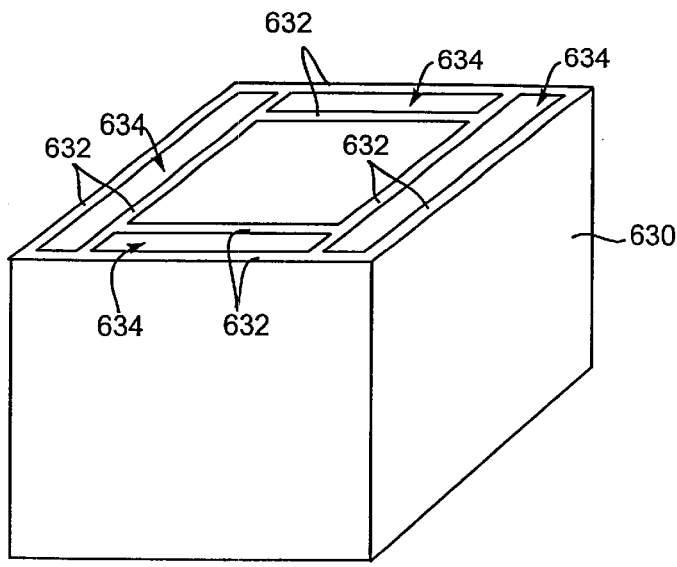
FIG. 22 is a perspective view of a test head formed by arranging sets of vertical probe pitch series of FIG. 14, wherein the pin pattern of the test head correspond with the terminal pattern of FIG. 16, and wherein the sets of vertical probe pitch series are affixed in a test head fixture.
Figure 23:
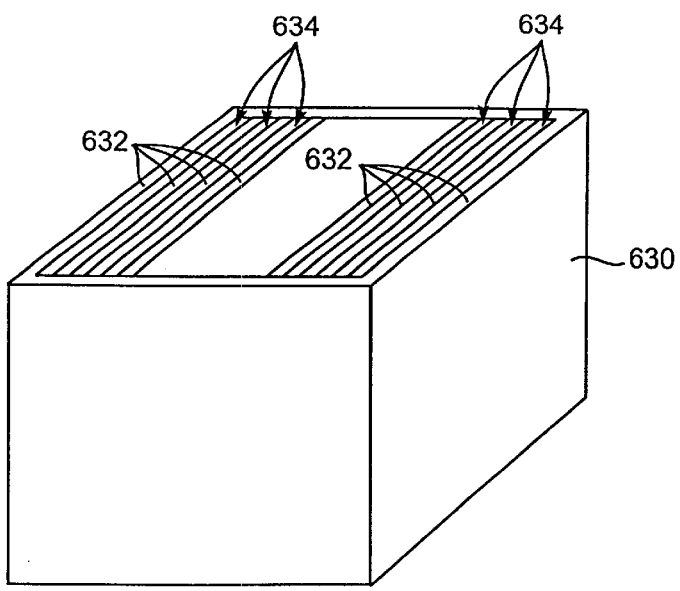
FIG. 23 is a perspective view of a test head formed by arranging sets of vertical probe pitch series of FIG. 14, wherein the pin pattern of the test head correspond with the terminal pattern of FIG. 18, and wherein the sets of vertical probe pitch series are affixed in a test head fixture.

Alternatively, instead of affixing the sets of vertical probe pitch series 600 by filling any open space with a medium, the sets of vertical probe pitch series 600 can be affixed with respect to each other by sliding the sets of vertical probe pitch series 600 into respective slots 634 formed between walls 632 of a rigid test head fixture 630, as illustrated in FIGS. 22 and 23.

Figure 24:
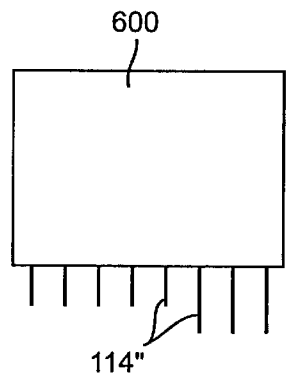
FIG. 24 is a front view of a vertical probe pitch series, wherein the pin contact tips are arranged in a non-coplanar relationship.
Figure 25:
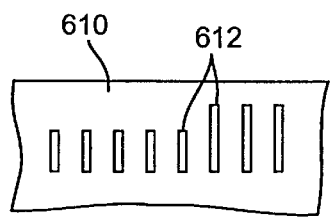
FIG. 25 is an enlarged view of slots formed in a mandrel, wherein the slots are off-center to form the pin contact tips of FIG. 24.

Although the pin contact tips 114" of the vertical probe pitch series 600 have been previously described has been described as being in a coplanar relationship, the vertical probe pitch series 600 can be manufactured, such that the pin contact tips 114" lie in different planes, as depicted in FIG. 24. In this manner, a vertical probe pitch series can be designed to address any difficulties posed by testing devices with non-coplanar terminals. This feature can be advantageous whether the device terminals are arranged in a fine pitch terminal pattern or a rough pitch terminal pattern. When manufacturing a vertical probe pitch series 600 having non-coplanar pin contact tips 114", the slots 612 formed in the mandrel 610 are arranged, such that the slots 612 are misaligned, as depicted in FIG. 25.

Although the foregoing invention has been described in some detail by way of illustration and example for purposes of clarity and understanding, it may be readily apparent to those of ordinary skill in the art in light of the teachings of this invention that certain changes and modifications may be made thereto without departing from the spirit or scope of the appended claims.

What is claimed is:

1. A method of manufacturing a test head, comprising:
   selecting an electrical circuit having a plurality of terminals arranged in a terminal pattern;
   providing a plurality of pitch series sets, each of said plurality of pitch series sets comprising a plurality of electrically conductive rigid pins, each of said plurality of rigid pins including a pin shaft and an exposed pin contact tip, said plurality of pin contact tips configured in a rectilinear pattern having a uniform pitch ratio, each of said plurality of pitch series sets further including a compliant registration medium carrying said plurality of rigid pins;
   arranging said plurality of pitch series sets with respect to each other, wherein said pluralities of pin contact tips are configured in a pin pattern corresponding to said terminal pattern; and
   affixing said plurality of pitch series with respect to each other.

2. The method of claim 1, wherein said plurality of pitch series sets is inventoried prior to said arrangement and affixation steps.

3. The method of claim 1, wherein said plurality of pitch series sets is affixed with respect to each other by encapsulating said plurality of pitch series into a block.

4. The method of claim 1, further comprising providing a rigid test head fixture having a plurality of cavities, and wherein said plurality of pitch series sets is affixed with respect to each other by respectively disposing said plurality of pitch series into said plurality of cavities.

5. The method of claim 1, wherein said terminal pattern is a peripheral terminal pattern, and said plurality of pitch series sets is arranged with respect to each other, such that said pluralities of pin contact tips are configured in a peripheral pin pattern corresponding to said peripheral terminal pattern.

6. The method of claim 5, wherein said plurality of pitch series sets comprises four pitch series sets, and wherein said four pitch series sets are arranged to form a hollow square.

7. The method of claim 1, wherein said terminal pattern is a two-dimensional terminal pattern, and said plurality of pitch series sets is arranged with respect to each other, such that said pluralities of pin contact tips are configured in a two-dimensional pin pattern corresponding to said two-dimensional terminal pattern.

8. The method of claim 7, wherein said plurality of pitch series sets is arranged side-by-side.

9. The method of claim 1, wherein said plurality of rigid pins comprises tungsten.

10. The method of claim 1, wherein said plurality of rigid pins is substantially straight.

11. The method of claim 1, wherein said plurality of rigid pins is angled.

12. The method of claim 1, wherein the plurality of pitch series sets arranged by the arranging step includes at least two different pitch series sets.

13. The method of claim 1, wherein the plurality of pitch series sets arranged by the arranging step includes at least two of the same pitch series sets.

14. A method of manufacturing a test head, comprising:
selecting an electrical circuit having a plurality of terminals arranged in a terminal pattern;
providing a plurality of pitch series sets, each of said plurality of pitch series sets comprising a plurality of electrically conductive rigid pins, each of said plurality of rigid pins including an exposed pin contact tip and a pin shaft having a pin shaft end opposite said pin contact tip, said plurality of pin contact tips configured in a rectilinear pattern having a uniform pitch ratio, each of said plurality of pitch series sets comprising a plurality of electrically conductive leads respective affixed to said plurality of pin shaft ends, each of said plurality of pitch series sets further including a compliant registration medium carrying said plurality of rigid pins;
arranging said plurality of pitch series sets with respect to each other, wherein said pluralities of pin contact tips are configured in a pin pattern corresponding to said terminal pattern; and
affixing said plurality of pitch series with respect to each other.

15. The method of claim 14, wherein said plurality of pitch series sets is inventoried prior to said arrangement and affixation steps.

16. The method of claim 14, wherein said plurality of pitch series sets is affixed with respect to each other by encapsulating said plurality of pitch series into a block.

17. The method of claim 14, further comprising providing a rigid test head fixture having a plurality of cavities, and wherein said plurality of pitch series sets is affixed with respect to each other by respectively disposing said plurality of pitch series into said plurality of cavities.

18. The method of claim 14, wherein said terminal pattern is a peripheral terminal pattern, and said plurality of pitch series sets is arranged with respect to each other, such that said pluralities of pin contact tips are configured in a peripheral pin pattern corresponding to said peripheral terminal pattern.

19. The method of claim 14, wherein said plurality of pitch series sets comprises four pitch series sets, and wherein said four pitch series sets are arranged to form a hollow square.

20. The method of claim 14, wherein said terminal pattern is a two-dimensional terminal pattern, and said plurality of pitch series sets is arranged with respect to each other, such that said pluralities of pin contact tips are configured in a two-dimensional pin pattern corresponding to said two-dimensional terminal pattern.

21. The method of claim 20, wherein said plurality of pitch series sets is arranged side-by-side.

22. The method of claim 14, wherein said plurality of rigid pins comprises tungsten.

23. The method of claim 14, wherein the plurality of pitch series sets arranged by the arranging step includes at least two different pitch series sets.

24. The method of claim 14, wherein the plurality of pitch series sets arranged by the arranging step includes at least two of the same pitch series sets.

* * * * *